(12) United States Patent
Weber et al.

(10) Patent No.: US 6,226,183 B1
(45) Date of Patent: *May 1, 2001

(54) ARRANGEMENT INCLUDING A SUBSTRATE FOR POWER COMPONENTS AND A HEAT SINK, AND A METHOD FOR MANUFACTURING THE ARRANGEMENT

(75) Inventors: Bernd Weber, Abstatt; Dietmar Hofsaess, Backnang; Werner Butschkau, Bietigheim-Bissingen; Thomas Dittrich, Neuhausen; Peter Schiefer, Untergruppenbach, all of (DE)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/297,037

(22) PCT Filed: Jun. 12, 1998

(86) PCT No.: PCT/DE98/01609

§ 371 Date: Jun. 21, 1999

§ 102(e) Date: Jun. 21, 1999

(87) PCT Pub. No.: WO99/11107

PCT Pub. Date: Mar. 4, 1999

(30) Foreign Application Priority Data

Aug. 25, 1997 (DE) .............................................. 197 36 962

(51) Int. Cl.⁷ ...................................................... H05K 7/20
(52) U.S. Cl. ........................... 361/704; 361/705; 361/719; 361/722; 174/16.3; 257/706; 257/707; 165/80.3; 165/185

(58) Field of Search ..................................... 361/700–712, 361/717–723, 761, 767, 773; 257/706–727, 737, 747, 720, 778, 734; 228/180.22, 248.1, 232, 239, 240, 248; 174/16.1, 16.2, 252, 50.1; 165/80.3, 185; 29/840, 842

(56) References Cited

U.S. PATENT DOCUMENTS 4,626,478 * 12/1986 Soerewyn .............................. 428/615
4,628,407 * 12/1986 August et al. ........................ 361/388

(List continued on next page.)

FOREIGN PATENT DOCUMENTS 25 28 000  1/1977  (DE) .
93 08 842  7/1993  (DE) .

(List continued on next page.)

OTHER PUBLICATIONS

"Anastrophic Conductive Paste", Toshiba Chemical Corp.

* cited by examiner

Primary Examiner—Leo P. Picard
Assistant Examiner—Michael Datskovsky
(74) Attorney, Agent, or Firm—Kenyon & Kenyon

(57) ABSTRACT

In an arrangement composed of a substrate and a heat sink, the substrate is provided on a first side with at least one power component arranged on a first large-surface printed circuit trace and, on a second side opposite the power component, with a second large-surface printed circuit trace, which is connected in a thermally conductive manner to the first printed circuit trace via via holes. The substrate is mounted at the second side onto the heat sink in a thermally conductive manner, in order to achieve a good heat coupling of the substrate to the heat sink and the same time to avoid an undesirable electrical contact between the potential-carrying printed circuit traces and the heat sink. The substrate having spacer elements arranged on the second side is placed onto the heat sink and to hold it at a defined distance from the heat sink, the gap formed by the distance between the substrate and the heat sink being filled with a thermally conductive filler.

9 Claims, 1 Drawing Sheet

U.S. PATENT DOCUMENTS

| | | | | |
|---|---|---|---|---|
| 5,261,593 | * | 11/1993 | Casson et al. | 228/180.22 |
| 5,352,926 | * | 10/1994 | Andrews | 257/717 |
| 5,375,039 | * | 12/1994 | Wiesa | 361/720 |
| 5,467,251 | * | 11/1995 | Katchmar | 361/719 |
| 5,541,450 | | 7/1996 | Jones et al. | |
| 5,646,826 | | 7/1997 | Katchmar. | |

FOREIGN PATENT DOCUMENTS

| | | |
|---|---|---|
| 197 28 632 | 2/1997 | (DE). |
| 197 23 409 | 12/1998 | (DE). |

ARRANGEMENT INCLUDING A SUBSTRATE FOR POWER COMPONENTS AND A HEAT SINK, AND A METHOD FOR MANUFACTURING THE ARRANGEMENT

FIELD OF THE INVENTION

BACKGROUND INFORMATION

A conventional arrangement is described in German Patent Application No. 1 95 28 62. In this publication, as the substrate a circuit board is indicated, which on its upper side is provided with an electronic circuit, which includes at least one power component that generates waste heat. Beneath the power component, the circuit board is provided with via holes, which divert the heat generated by the power component to the lower side of the circuit board. Between lower side of the circuit board and a control unit housing functioning as a heat sink, a thermally conductive filler is arranged. During operation, the heat produced by the power components is diverted via the via holes to the lower side of the circuit board and from there is delivered via the thermally conductive filler to the housing, which functions as a heat sink. In this context, it is disadvantageous that printed circuit traces that conduct potential on the lower side of the circuit board can come into contact with the heat sink during assembly of the circuit board in the control unit. A short-circuit that is caused in this way can damage or destroy the sensitive electronic components on the circuit board.

In addition, German Patent Application No. 1 97 23 409 describes an arrangement having a substrate and a heat sink. On the upper side of the circuit board, a power component is deposited on a large-surface printed circuit trace, which is connected by via holes to a large-surface printed circuit trace on the lower side of the circuit board. On the lower side of the circuit board, a metal layer is deposited under the large-surface printed circuit trace arranged there and over an insulation layer, which in turn is deposited through a solder stop mask onto a control unit housing part that is provided as a heat sink. In this arrangement, although an electrical contact between the printed circuit traces and a heat sink is prevented by the insulation layer, it is disadvantageous that the insulation layer and the further metal layer complicate the direct heat transfer to the heat sink, increase the space requirements of the arrangement, and also make manufacturing more expensive.

SUMMARY OF THE INVENTION

The arrangement according to the present invention avoids the disadvantages arising in the conventional arrangements. As a result of spacer elements placed on the side of the substrate opposite the power components and a thermally conductive filler introduced between the substrate and the heat sink, an effective heat coupling of the substrate to the heat sink is advantageously achieved, on the one hand, and an undesirable electrical contact between the printed circuit traces carrying potential and located on the side of this substrate and the heat sink is dependably avoided, on the other hand. In addition, a particularly space-saving arrangement can be realized. Additional layers, making manufacturing more expensive, such as an additional insulating layer or a further metal layer deposited onto the insulation layer, are not necessary, so that the costs in this regard can be saved.

It is also advantageous if the spacer elements are composed of conductor surface elements on the lower side of the substrate, which are coated using a preselected quantity of solder, since for this purpose, in particular for substrates that are fitted with components on both sides, no additional manufacturing step is required. The conductor surface elements can be manufactured together with the connecting surfaces of the electronic components provided on the lower side, and can be coated with solder.

A solder resist deposited on the side of the substrate opposite the power components prevents solder from mistakenly reaching locations that are not provided therefore during the application of the solder.

If the power component and the heat sink have the same electric potential, it is advantageous to integratedly manufacture the conductor surface elements directly in the second large-surface printed circuit trace, since in this way the heat transfer is improved.

In addition, it is advantageous if the thermally conductive filler provided between the substrate and the heat sink is a thermally conductive adhesive or a thermally conductive adhesive foil, by which the substrate can also be mechanically secured to the heat sink.

The spacer elements resting on the heat sink can advantageously also be used as a ground connection of the substrate to the heat sink and for improving the EMV behavior (electromagnetic compatibility).

In addition, the present invention relates to a method for manufacturing an arrangement composed of a substrate and a heat sink. In particular, in the case of substrates having components on both sides, no additional manufacturing steps are necessary for carrying out the method according to the present invention. The conductor surface elements can be manufactured together with the printed circuit traces provided on the second side. The deposition of solder necessary for the manufacture of the spacer elements can be carried out together with the soldering of the connecting surfaces for components, which makes the method particularly economical, since scarcely any additional costs arise for manufacturing the spacer elements.

It is advantageous to imprint the solder onto the conductor surface elements in a solder paste imprinting station, since this technology is particularly well suited for depositing a defined quantity of solder and can be controlled very well. In a subsequent reflow soldering step, the solder is melted, the spacer elements being formed at a height defined by the quantity of solder deposited. The reflow solder step can advantageously take place with the reflow soldering of the SMD components provided on the substrate.

It is easy to apply a thermally conductive adhesive or a thermally conductive adhesive foil first onto the heat sink and subsequently to place the substrate onto the heat sink coated with the adhesive or the adhesive foil such that the spacer elements are impressed into the adhesive, they being able to contact the heat sink via the solder layer.

DETAILED DESCRIPTION

Figure 1:
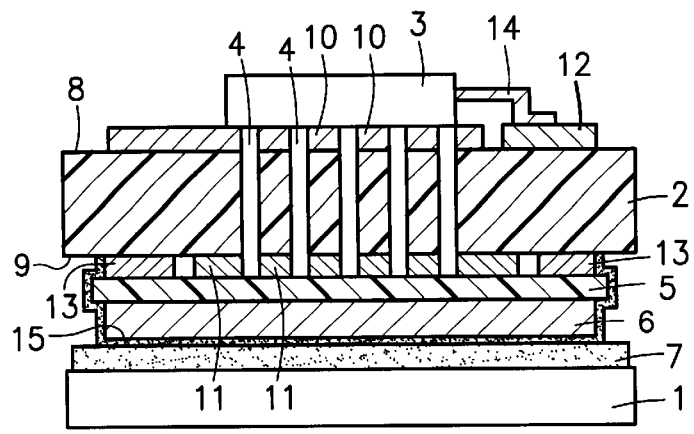
FIG. 1 shows a cross-section of a conventional arrangement having an insulation layer and an additional copper plate.

FIG. 1 shows a conventional arrangement for diverting the waste heat produced in a control unit by a power component. On upward-facing first side 8, a circuit board 2 is provided with a first large-surface printed circuit trace 10 and, on the downward-facing second side 9, with a second large-surface printed circuit trace 11. The first large-surface printed circuit trace 10 and a second large-surface printed circuit trace 11 are well connected with each other in a thermally conductive manner, by numerous via holes 4 extending across the circuit board. A power component 3, for example, an SMD component, is applied onto first large-surface printed circuit trace 10, the component being conductively connected via connections 14 to further printed circuit traces 12, insulated from large-surface printed circuit trace 10, on upper side 8 of circuit board 2. For simplicity's sake, only one printed circuit trace 12 is depicted. On lower side 9, further potential-carrying printed circuit traces 13 are located, which are arranged so as to be insulated from second large-surface printed circuit trace 11. In addition, on lower side 9, provision is made for further undepicted SMD components, which are soldered on the lower side to undepicted connecting surfaces. Furthermore, a copper plate 6, which is used as a heat sink, is deposited onto second large-surface printed circuit trace 11 and printed circuit traces 13 via an electrically insulating, thermally conductive insulation layer 5. A solder resist 15, in turn, is applied onto copper plate 6, the resist preventing a deposition of the solder on the copper during the soldering of the connecting surfaces for the SMD components. Underneath solder resist 15, provision is made for a thermally conductive adhesive 7, which is applied onto a base part 1 control unit housing, the base part being provided as a heat sink. It is also known to press the copper plate directly onto the heat sink using a screw-type mounting means. In any case, the heat produced by power component 3 is dissipated via the via holes onto large-surface printed circuit trace 11 and via insulation layer 5 onto copper plate 6. From there, the heat is transferred to heat sink 1 by solder resist 15 either directly or via thermally conductive adhesive 7. If circuit board 2 were applied to the heat sink without insulation layer 5 and copper sink 6, a short-circuit between potential-carrying printed circuit traces 13 could lead to damaging the components. However, in the arrangement shown in FIG. 1, it is disadvantageous, that in order to apply insulation layer 5 and additional copper plate 6, two further, separate manufacturing steps are required.

Figure 2:
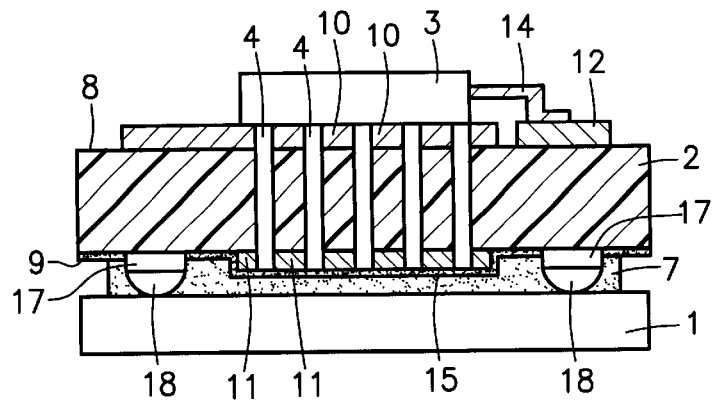
FIG. 2 shows a cross-section of a first exemplary embodiment of an arrangement according to the present invention.

FIG. 2 shows a first exemplary embodiment of an arrangement according to the present invention for dissipating the waste heat of a power component, the arrangement being preferably installed in an electronic control unit of a motor vehicle. At least one power component, e.g., a power semiconductor, is applied onto a large-surface printed circuit trace 10 on upper side 8 of a substrate 2, which can be a circuit board, a hybrid, or another substrate furnished with an electronic circuit. In the exemplary embodiment depicted here, substrate 2 is a circuit board having components on both sides. As can be seen further in FIG. 2, a connection 14 of power component 3 is electrically connected to a connecting printed circuit trace 12 of upper side 8 of circuit board 2, the connecting printed circuit trace being insulated from printed circuit trace 10. On lower side 9 of circuit board 2, a second large-surface printed circuit trace 11 is applied, which is connected in a thermally conductive manner to first printed circuit trace 10 on upper side 8 by via holes 4. In addition, still other undepicted printed circuit traces, associated with the circuit, as well as a number of connecting surfaces for SMD components are provided on lower side 9. As is depicted in FIG. 2, on lower side 9 of circuit board 2, provision is further made for conductor surface elements 17, which can be manufactured together with the remaining printed circuit traces and connection surfaces and can be made from the same material on the lower side of the circuit board. This can take place using the customary known technologies. In the exemplary embodiment depicted in FIG. 2, a voltage is transmitted to second large-surface printed circuit trace 11 from power component 3 by via holes 4. Conductor surface elements 17 are therefore arranged on the substrate insulated from printed circuit trace 11. Furthermore, a solder resist 15 is applied in the known manner onto lower side 9, provision being made for recesses in the solder resist at the locations of conductor surface elements 17 and at the undepicted connection surfaces for SMD components. In the manufacture of the arrangement depicted in FIG. 2, circuit board 2 is turned with lower side 9 facing upwards, and, in a solder paste imprinting station, is imprinted using solder paste. In this context, solder is applied onto conductor surface elements 17 and onto connection surfaces for SMD components. Solder resist 15 prevents solder from reaching other circuit parts in the process. After the imprinting of the solder, circuit board 2 is conveyed to an assembly machine, which impresses the SMD components into the solder paste applied on the connection surfaces on upwards-facing lower side 9 of the circuit board. Subsequently, the circuit board passes through a reflow solder station, in which the solder is melted. In this context, it is advantageous if the SMD components are soldered to the connecting surfaces and, at the same time, the spacer elements 17, 18 are formed. This takes place by liquefying solder 18 that is impressed onto conductor surface elements 17, in the reflow oven, and, as a result of the surface tension of the solder on surface pieces 17, solder humps or solder caps of a defined size are formed, whose shape is a function only of the size of the conductor surface elements 17 and of the quantity of solder that is impressed. In particular, using the described method, it is possible to configure all the spacer elements having one precisely defined uniform height. In this context, it is advantageous that the solder paste imprinting step and the reflow soldering step must in any case be carried out for circuit boards having components on two sides, so that no additional manufacturing step is required for producing the spacer elements. In place of the manufacturing process described above, it is also possible to moisten the conductor surface elements, e.g., in a wave solder bath using liquefied solder. It is advantageous that the spacer elements be manufactured at a defined height. After the manufacture of spacer elements 17, 18, a thermally conductive adhesive 7 is applied onto a heat sink 1 using a dispensing device. In a further exemplary embodiment, provision is made for employing a thermally conductive foil, having adhesive on both sides, in place of the adhesive. Functioning as heat sink is a housing part of the control unit, for example, the housing base. Circuit board 2 is then placed onto the adhesive with its lower side 9 turned toward heat sink 1 and, in this manner, is pressed in the direction of the heat sink so that spacer elements 17, 18 penetrate into adhesive 7. In this context, they can contact heat sink 1 and thus obtain a minimal spacing. In this context, a trough-shaped recess, not depicted in FIG. 2, in the housing base of the control unit receives the components arranged on the lower side of the circuit board. As a result of spacer elements 17, 18, a defined gap is formed between the lower side of the circuit board and the heat sink, the gap, as shown in FIG. 2, being completely filled with adhesive 7. Because the spacer elements can be manufactured having a defined small height, the gap can be set very small without the heat sink contacting the lower side of the circuit board, which improves the heat removal to the heat sink.

The arrangement shown in FIG. 2 can, also be manufactured, for example, in that circuit board 2 having spacer elements 17, 18 is first placed onto the heat sink, only subsequently an adhesive capable of capillary flow being introduced into the gap between the circuit board lower side and the heat sink.

Spacer elements 17, 18 can advantageously be used also for the EMV protection (electromagnetic compatibility) of the arrangement. Since the spacer elements are composed of an electrically conductive material, an electrical contact to the heat sink is generated by them, i.e., spacer elements and heat sink have the same potential. If at least some conductor surface elements 17 are connected to printed circuit traces associated with the circuit, then, via the spacer elements, a short and thus low-radiation ground connection can be realized.

Figure 3:
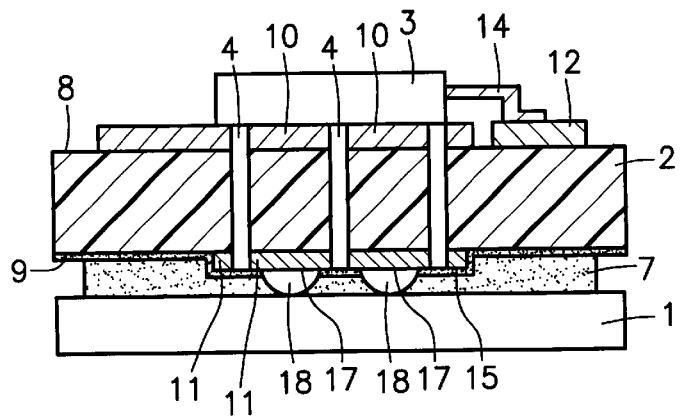
FIG. 3 shows a cross-section of a second exemplary embodiment of the arrangement according to the present invention.

A second exemplary embodiment is depicted in FIG. 3. The same numbers denotes the same parts. The arrangement depicted in FIG. 3 differs from the arrangement depicted in FIG. 2 in that power component 3 and heat sink have the same potential. Therefore, the conductor surface elements 17 can advantageously be directly integrated into second large-surface printed circuit trace 11 of substrate 2. Solder resist mask 15, applied on second side 9 of substrate 2, has recesses which define conductor surface elements 17. Solder caps 18, as described above, are formed on these conductor surface elements. Subsequently, the substrate is placed onto heat sink 1 or adhesive 7. Since power component 3, printed circuit trace 11, and heat sink 1 have the same potential, no short-circuit is generated by spacer elements 18. In comparison to the first embodiment shown in FIG. 2, the heat transfer by the arrangement of solder caps 18 on second large-surface printed circuit trace 11 can be improved.

What is claimed is:

1. An arrangement comprising:
   a substrate;
   a heat sink;
   at least one power component situated on a first side of the substrate;
   a first large-surface printed circuit trace, the at least one power component being situated on the first large-surface printed circuit trace;
   a second large-surface printed circuit trace situated on a second side of the substrate the second side being opposite to the at least one power component, the first large-surface printed circuit trace being coupled to the second large-surface printed circuit trace via at least one hole in a thermally conductive manner; and
   a plurality of spacer elements located between the second side of the substrate and a first surface of the heat sink, wherein:
      the substrate is maintained at a predetermined distance from the heat sink by the plurality of spacer elements so that a fixed gap is formed between the second side of the substrate and the first surface of the heat sink, the fixed gap being filled with a thermally conductive filler; and
      the plurality of spacer elements is formed by a plurality of conductor surface elements, each of the conductor surface elements being coated with a predetermined amount of solder.

2. The arrangement according to claim 1, wherein contacts between the conductor surface elements are coated with solder, and wherein the contacts enable the plurality of spacer elements to electrically couple the heat sink to the substrate so that the heat sink provides a ground connection for the substrate.

3. The arrangement according to claim 1, further comprising:
   a solder resist coating the second side of the substrate without coating the conductor surface elements.

4. The arrangement according to claim 3, wherein the at least one power component and the heat sink have substantially the same electrical potential, and wherein the conductor surface elements are integrated with the second large-surface printed circuit trace.

5. The arrangement according to claim 1, wherein the thermally conductive filler is one of a hardenable thermally conductive adhesive and a thermally conductive foil which has an adhesive on both sides thereof.

6. The arrangement according to claim 1, wherein the arrangement is utilized in an electronic control unit.

7. A method of manufacturing an arrangement including a substrate, a heat sink, at least one power component situated on a first side of the substrate, a first large-surface printed circuit trace accommodating the at least one power component thereon, and a second large-surface printed circuit trace situated on a second side of the substrate, the second side being opposite the first side, the first large-surface printed circuit trace being thermally conductively coupled to the second large-surface printed circuit trace via at least one hole, the method comprising the steps of:
   providing a plurality of conductor surface elements on the second side of the substrate;
   applying a solder resist to the second side of the substrate without applying the solder resist to the conductor surface elements;
   coating the conductor surface elements with a predetermined amount of a solder, the predetermined amount of the solder being selected to form a plurality of spacer elements of a preselected height;
   placing the substrate, and the spacer elements situated thereon, on a first surface of the heat sink; and
   introducing a thermally conductive filler between the second side of the substrate and the first surface of the heat sink.

8. The method according to claim 7, further comprising the step of:
   imprinting the solder onto the conductor surface elements at a solder paste imprinting station, wherein the spacer elements are generated in a reflow solder station by performing a subsequent reflow soldering procedure on the substrate.

9. The method according to claim 7, further comprising the steps of:
   applying the thermally conductive filler to the first surface of the heat sink, the thermally conductive filler being one of a thermally conductive hardening adhesive and a thermally conductive foil having an adhesive on both sides thereof; and
   pressing the substrate onto the first surface of the heat sink so that the spacer elements pass through the one of the thermally conductive adhesive and the adhesive on the thermally conductive foil to contact the first surface of the heat sink.

* * * * *

UNITED STATES PATENT AND TRADEMARK OFFICE
CERTIFICATE OF CORRECTION

PATENT NO. : 6,226,183 B1 Page 1 of 1
DATED : May 1, 2001
INVENTOR(S) : Bernd Weber et al.

It is certified that error appears in the above-identified patent and that said Letters Patent is hereby corrected as shown below:

Column 1,
Line 7, insert -- The invention relates to an arrangement having a substrate for power components and a heat sink, and to a method for manufacturing such an arrangement --

Column 5,
Line 1, change "2 can," to -- 2 can --

Signed and Sealed this

Twenty-eighth Day of January, 2003

JAMES E. ROGAN
*Director of the United States Patent and Trademark Office*